(12) United States Patent
Zhong et al.

(10) Patent No.: US 12,513,817 B2
(45) Date of Patent: Dec. 30, 2025

(54) CIRCUIT BOARD AND MANUFACTURING METHOD THEREOF

(71) Applicants: Avary Holding (Shenzhen) Co., Ltd., Shenzhen (CN); QingDing Precision Electronics (Huai'an) Co., Ltd., Jiangsu Province (CN); Garuda Technology Co., Ltd., New Taipei (TW)

(72) Inventors: Hao-Wen Zhong, Shenzhen (CN); Fang-Bo Xu, Shenzhen (CN)

(73) Assignees: QINGDING PRECISION ELECTRONICS (HUAI'AN) CO., LTD., Jiangsu Province (CN); GARUDA TECHNOLOGY CO., LTD., New Taipei (TW)

(*) Notice: Subject to any disclaimer, the term of this patent is extended or adjusted under 35 U.S.C. 154(b) by 197 days.

(21) Appl. No.: 18/457,106

(22) Filed: Aug. 28, 2023

(65) Prior Publication Data

US 2025/0031301 A1 Jan. 23, 2025

(30) Foreign Application Priority Data

Jul. 20, 2023 (CN) .......................... 202310897016.6

(51) Int. Cl.
*H05K 1/02* (2006.01)
*H05K 3/00* (2006.01)

(52) U.S. Cl.
CPC .......... *H05K 1/028* (2013.01); *H05K 3/0011* (2013.01); *H05K 2201/0195* (2013.01)

(58) Field of Classification Search
CPC .... H05K 1/028; H05K 1/0281; H05K 1/0224; H05K 1/0225; H05K 3/4691; H05K 2201/0195
See application file for complete search history.

(56) References Cited

U.S. PATENT DOCUMENTS 11,197,368 B1 * 12/2021 Shen .................... H05K 1/0219
2021/0345914 A1 11/2021 Moein et al.
(Continued)

FOREIGN PATENT DOCUMENTS

CN 201286194 Y 8/2009
CN 202514155 U 10/2012
(Continued)

*Primary Examiner* — Roshn K Varghese
(74) *Attorney, Agent, or Firm* — MUNCY, GEISSLER, OLDS & LOWE, P.C.

(57) ABSTRACT

A circuit board includes a first multilayered structure, a second multilayered structure, a third multilayered structure, a first adhesive layer, a second adhesive layer and a plurality of hollow portions. The first adhesive layer is disposed between the first multilayered structure and the second multilayered structure. The second adhesive layer is disposed between the second multilayered structure and the third multilayered structure, wherein the second multilayered structure is arranged between the first adhesive layer and the second adhesive layer. The plurality of hollow portions are formed on at least one of the first multilayered structure, the second multilayered structure and the third multilayered structure. When the circuit board is bent, a force is applied on the plurality of hollow portions to make the plurality of hollow portions deform and change a cross-sectional area of each of the plurality of hollow portions.

7 Claims, 9 Drawing Sheets

(56) References Cited

U.S. PATENT DOCUMENTS

2023/0052711 A1\* 2/2023 Aramaki .............. H01B 7/0853
2023/0299453 A1\* 9/2023 Ikemoto ................ H05K 1/144
  333/238

FOREIGN PATENT DOCUMENTS

| CN | 206452599 U | 8/2017 |
| CN | 109360499 A | 2/2019 |
| CN | 111045264 A | 4/2020 |
| CN | 111667770 A | 9/2020 |
| CN | 112071207 A | 12/2020 |
| CN | 112309996 A | 2/2021 |
| CN | 112991953 A | 6/2021 |
| CN | 114284324 A | 4/2022 |
| CN | 115103506 A | 9/2022 |
| TW | 592428 U | 6/2004 |
| TW | 07/23/2025 | 9/2021 |
| WO | WO-2022/000607 A1 | 1/2022 |

\* cited by examiner

CIRCUIT BOARD AND MANUFACTURING METHOD THEREOF

RELATED APPLICATIONS

This application claims priority to China Application Serial Number 202310897016.6, filed Jul. 20, 2023, which is herein incorporated by reference.

BACKGROUND

Technical Field

The present disclosure relates to a circuit board and a manufacturing method thereof. More particularly, the present disclosure relates to a circuit board, which has less buckling deformation as bending, and a manufacturing method thereof.

Description of Related Art

The rapid development of electronic products makes the importance of display devices increase. In order to expand the applications of the display devices, the development of flexible display devices has gradually become one of the top priorities of every manufacturer. In recent years, foldable screens have been in favor with the mobile phone manufacturers because foldable screens have the advantages of convenient storage and large screen area. Thus, foldable smartphones have been developed. The foldable screens used in smartphones have to undergo hundreds of thousands or even millions of times of bending. The flexible circuit boards for electrical connection therein should undergo as much times of bending as the foldable screens. Therefore, the durability of flexible circuit boards is also pretty important.

Please refer to FIG. 8. FIG. 8 is a bending schematic view of a conventional flexible circuit board 900. The structure of the conventional flexible circuit board 900 is a multilayered structure. Each adhesive layer is used for the connection between two layers. The adhesive layers are not disposed at the bending area to remain air gaps A, so as to prevent too much stress when the conventional flexible circuit board 900 is bent. However, when the conventional flexible circuit board 900 is bent, the inner structure 910 is compressed, and the outer structure 920 is stretched. Due to the thickness of each layer, the bending radius between each layer is also different, and the bending size thereof cannot be matched, resulting in the inner structure 910 being compressed and forming buckling deformation. The buckling part is likely to generate friction with, be pushed or hit by other elements, which leads to a structural damage of the conventional flexible circuit board 900.

In this regard, it is still a goal for the industry to pursue to increase the service life of the flexible circuit board by improving the bending condition of the flexible circuit board.

SUMMARY

The present disclosure provides a circuit board including at least one bending area and at least one non-bending area, wherein the at least one bending area abuts the at least one non-bending area. The circuit board includes a first multilayered structure, a second multilayered structure, a third multilayered structure, a first adhesive layer, a second adhesive layer and a plurality of hollow portions. The first multilayered structure includes a first flexible material layer and a first cover film, and the first cover film is disposed on the first flexible material layer. The second multilayered structure includes a second flexible material layer and a second cover film, and the second cover film is disposed on the second flexible material layer. The third multilayered structure includes a third flexible material layer and a third cover film, and the third cover film is disposed on the third flexible material layer. The first adhesive layer is disposed between the first multilayered structure and the second multilayered structure, and adhered to the first flexible material layer and the second cover film, wherein the first flexible material layer, the first adhesive layer and the second cover film are arranged between the first cover film and the second flexible material layer. The second adhesive layer is disposed between the second multilayered structure and the third multilayered structure, and adhered to the second flexible material layer and the third flexible material layer, wherein the second multilayered structure is arranged between the first adhesive layer and the second adhesive layer, and the second flexible material layer, the second adhesive layer and the third flexible material layer are arranged between the second cover film and the third cover film. A first compartment is formed between the first multilayered structure and the second multilayered structure, and a second compartment is formed between the second multilayered structure and the third multilayered structure. The plurality of hollow portions are formed on at least one of the first multilayered structure, the second multilayered structure and the third multilayered structure. The plurality of hollow portions, the first compartment and the second compartment are arranged in the at least one bending area, and the plurality of hollow portions are communicated with at least one of the first compartment and the second compartment. When the at least one bending area is bent, a force is applied on the plurality of hollow portions to make the plurality of hollow portions deform and change a cross-sectional area of each of the plurality of hollow portions.

The present disclosure provides a manufacturing method of a circuit board, which includes the steps as follows. A multilayered structure is provided, wherein the multilayered structure includes a flexible material layer and a cover layer, and the cover layer is disposed on the flexible material layer. Two spacers are stuck to two sides of the multilayered structure respectively, so as to make the two spacers respectively be connected to the flexible material layer and the cover layer. Two flexible material films are stuck to the two sides of the multilayered structure respectively, so as to make the two flexible material films respectively be connected to the flexible material layer and the cover layer, and the two spacers are respectively arranged between the two flexible material films and the multilayered structure. Two cover films are stuck to the two flexible material films respectively, so as to make the two flexible material films be respectively arranged between the two cover films and the multilayered structure. A plurality of hollow portions are arranged, wherein the plurality of hollow portions are formed on at least two of the flexible material layer, the cover layer, the two flexible material films and the two cover films, and the plurality of hollow portions extend to at least one of the two spacers. The two spacers are removed when the plurality of hollow portions are arranged.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
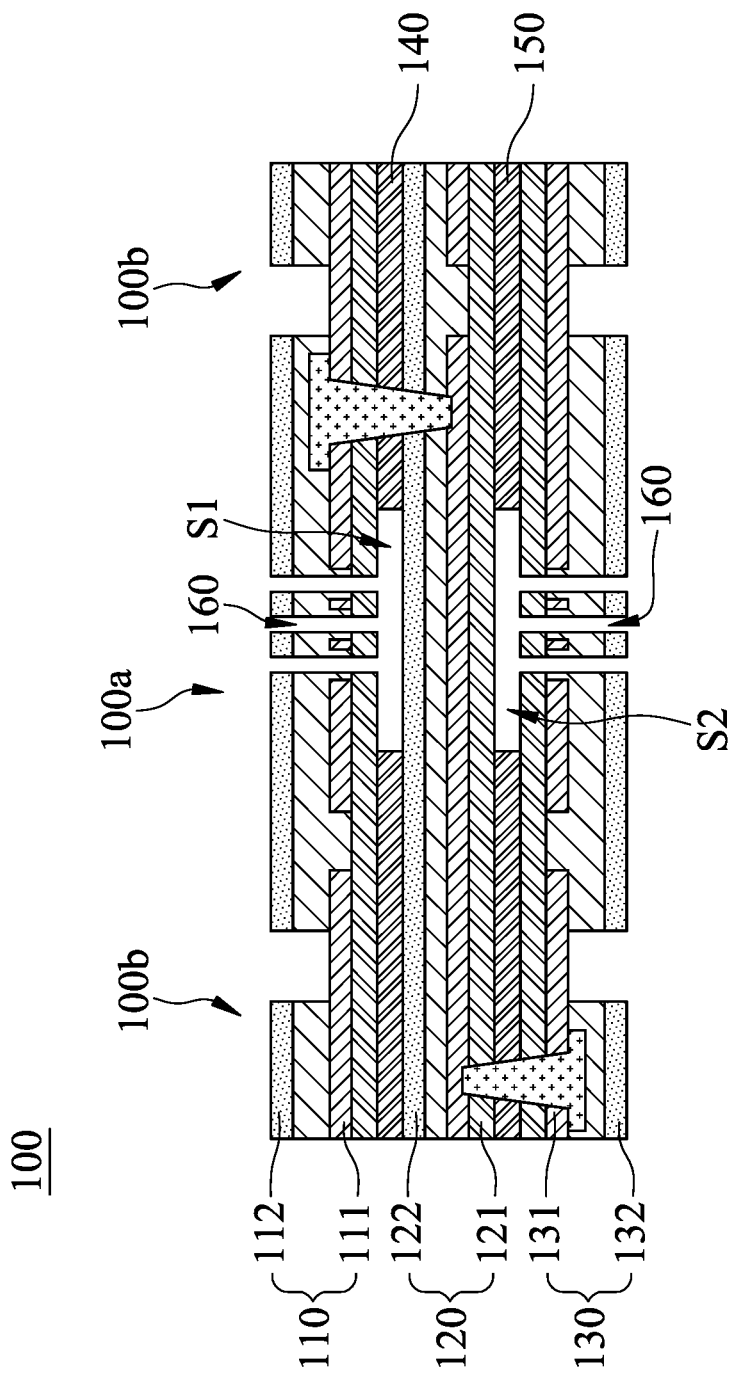
FIG. 1 is a cross-sectional schematic view of a circuit board according to one embodiment of the present disclosure.

The following disclosure provides many different embodiments or examples, for implementing different features of the provided subject matter. Specific examples of elements, values, operations, materials, configurations and the like are described below to simplify the present disclosure. These are, of course, merely examples and are not intended to be limiting. Other elements, values, operations, materials, configurations and the like are also considered. For example, in the following description, forming a first feature over a second feature may include an embodiment in which the first and second features are formed in direct contact, and may also include an embodiment in which additional features may be formed between the first and second features, such that the first and second features may not be in direct contact. In addition, the present disclosure may repeat reference numerals and/or letters in the various examples. This repetition does not indicate a relationship between the various embodiments and/or configurations discussed.

In the following description, in order to clearly present the technical features of the present disclosure, the dimensions (such as length, width, thickness, and depth) of elements (such as layers, films, substrates, and areas) in the drawings will be enlarged in unusual proportions, and the number of some elements might be decreased. Accordingly, the description and explanation of the following embodiments are not limited to the quantities, sizes and shapes of the elements presented in the drawings, but should cover the sizes, shapes, and deviations of the two due to actual manufacturing processes and/or tolerances. For example, the flat surface shown in the drawings may have rough and/or non-linear characteristics, and the acute angle shown in the drawings may be round. Therefore, the elements presented in the drawings in this case which are mainly for illustration are intended neither to accurately depict the actual shape and quantity of the elements nor to limit the scope of patent applications in this case.

Please refer to FIG. 1. FIG. 1 is a cross-sectional schematic view of a circuit board 100 according to one embodiment of the present disclosure. In some embodiments of the present disclosure, the circuit board 100 includes at least one bending area 100a and at least one non-bending area 100b, wherein the at least one bending area 100a abuts the at least one non-bending area 100b. The circuit board 100 includes a first multilayered structure 110, a second multilayered structure 120, a third multilayered structure 130, a first adhesive layer 140, a second adhesive layer 150 and a plurality of hollow portions 160.

In detail, the first multilayered structure 110 includes a first flexible material layer 111 and a first cover film 112, and the first cover film 112 is disposed on the first flexible material layer 111. The second multilayered structure 120 includes a second flexible material layer 121 and a second cover film 122, and the second cover film 122 is disposed on the second flexible material layer 121. The third multilayered structure 130 includes a third flexible material layer 131 and a third cover film 132, and the third cover film 132 is disposed on the third flexible material layer 131. Three multilayered structures are taken as an example in the present disclosure. However, in actual manufacturing processes, the number of multilayered structure can be increased or decreased to meet the requirements. Also, each multilayered structures can have the same or similar structural design, and the present disclosure is not limited to the number or the structure of the multilayered structures.

The first flexible material layer 111, the second flexible material layer 121 and the third flexible material layer 131 can respectively be a flexible copper clad laminate (FCCL), or can respectively include a flexible substrate (the number thereof is omitted) and a conductive layer (the number thereof is omitted). The material of the flexible substrate can be selected from a group consisting of polyester (PET), polyimide (PI), polyetherimide (PEI), polyethylene naphthalate (PEN) and fluoropolymer. The conductive layer can be a copper foil, an aluminum foil, a beryllium copper alloy foil or other conductive films having great flexibility. An adhesive can be used to connect the flexible substrate and the conductive layer, and the adhesive can be selected from the group consisting of a polyester adhesive, an acrylic adhesive, an epoxy adhesive, a polyimide adhesive and a phenolic-butyral adhesive. Therefore, the circuit layouts can be carried out on the first flexible material layer 111, the second flexible material layer 121 and the third flexible material layer 131, and a circuit is formed on the conductive layers thereof to facilitate current transmission.

The material of the first cover film 112, the second cover film 122 and the third cover film 132 can be polyester resin, polyimide resin, epoxy resin, phenolic resin, polyphenylene oxide (PPO) resin, cyanate ester (CE) resin, polytetrafluoroethylene (PTFE) resin, BT resin (bismaleimide triazine resin) or other polymer materials with insulation properties, and can be manufactured in to a thin film to protect the first flexible material layer 111, the second flexible material layer 121 and the third flexible material layer 131, so as to avoid the conductive layers thereof being exposed to the air and causing oxidation or damage.

The first adhesive layer 140 is disposed between the first multilayered structure 110 and the second multilayered structure 120, and adhered to the first flexible material layer 111 and the second cover film 122, which makes the first flexible material layer 111, the first adhesive layer 140 and the second cover film 122 be arranged between the first cover film 112 and the second flexible material layer 121. Moreover, the second adhesive layer 150 is disposed between the second multilayered structure 120 and the third multilayered structure 130, and adhered to the second flexible material layer 121 and the third flexible material layer 131. The second multilayered structure 120 is arranged between the first adhesive layer 140 and the second adhesive layer 150, and the second flexible material layer 121, the second adhesive layer 150 and the third flexible material layer 131 are arranged between the second cover film 122 and the third cover film 132. Therefore, the first multilayered structure 110, the second multilayered structure 120 and third multilayered structure 130 can be fixed.

The first adhesive layer 140 and the second adhesive layer 150 can be arranged partially in the overall structure, which forms a first compartment S1 between the first multilayered structure 110 and the second multilayered structure 120, and a second compartment S2 form between the second multilayered structure 120 and the third multilayered structure 130. For example, the first adhesive layer 140 and second adhesive layer 150 can be mainly disposed in the at least one non-bending area 100b of the circuit board 100. Therefore, the first compartment S1 and the second compartment S2 will be located in the at least one bending area 100a of the circuit board 100. When the circuit board 100 is bent, the first compartment S1 and second compartment S2 help the first multilayered structure 110, the second multilayered structure 120 and the third multilayered structure 130 to release the compressive stress and tensile stress. It should be mentioned that, the positions of the first adhesive layer 140, the second adhesive layer 150, the first compartment S1 and the second compartment S2 can be adjusted according to the actual condition of applications, and the present disclosure is not limited to the aforementioned arrangements.

The plurality of hollow portions 160 are formed on at least one of the first multilayered structure 110, the second multilayered structure 120 and the third multilayered structure 130. The plurality of hollow portions 160, the first compartment S1 and the second compartment S2 are arranged in the at least one bending area 100a, and the plurality of hollow portions 160 are communicated with at least one of the first compartment S1 and the second compartment S2. In detail, the plurality of hollow portions 160 are preferably formed on the first multilayered structure 110 and the third multilayered structure 130 to reserve enough space for circuit layouts. Also, take the circuit board 100 being bent toward the first multilayered structure 110 for example, the plurality of hollow portions 160 help the first multilayered structure 110 to release compressive stress and the third multilayered structure 130 to release tensile stress.

Furthermore, the first flexible material layer 111 can be electrically connected to the second flexible material layer 121 in the at least one non-bending area 100b, and the second flexible material layer 121 can be electrically connected to the third flexible material layer 131 in the at least one non-bending area 100b. Therefore, the first multilayered structure 110, the second multilayered structure 120 and the third multilayered structure 130 can be electrically connected, and the position of electrical connection is arranged in the at least one non-bending area 100b, which will not be affected when the circuit board 100 is bent.

Figure 2A:
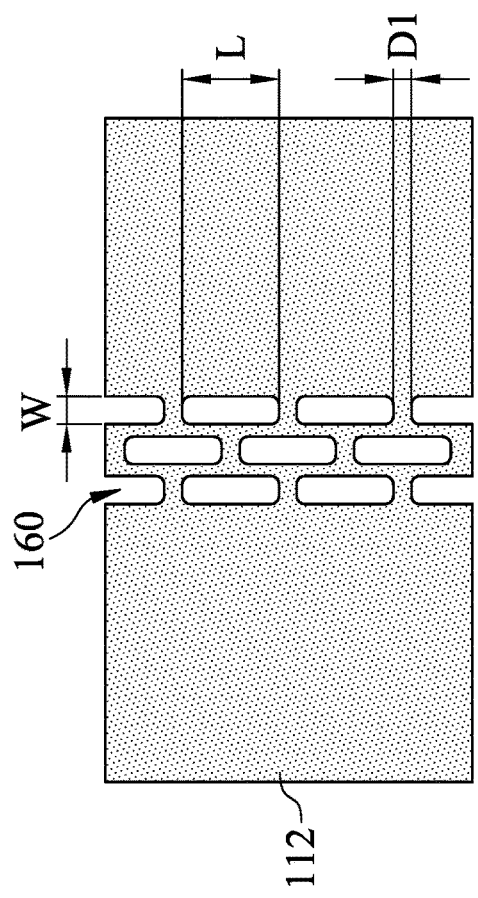
FIG. 2A is a partial top schematic view of the circuit board according to one embodiment of the present disclosure.

Please refer to FIG. 2A. FIG. 2A is a partial top schematic view of the circuit board 100 according to one embodiment of the present disclosure. The plurality of hollow portions 160 can be arranged in a staggered way to form a honeycomb hollow structure, or can be in a regular array distribution with uniform size. When the at least one bending area 100a is flat, a surface shape of each of the plurality of hollow portions 160 can be rectangular. Each of the plurality of hollow portions 160 has a length L and a width W, a ratio of the length L to the width W (that is, L/W) can be larger than or equal to 1. The width W can be larger than or equal to 0.3 mm. A shortest distance D1 can be between adjacent two of the plurality of hollow portions 160, and the shortest distance D1 can be larger than or equal to 0.3 mm. Through the aforementioned structural arrangement, the deformation and restoring ability of the circuit board 100 during the processes such as bending, stretching, compression or torsion can be improved, and enough space can be reserved for circuit layouts. Moreover, the plurality of hollow portions 160 can be manufactured by UV laser cutting. A distance between the outer edge of the plurality of hollow portions 160 and the circuit arranged between the plurality of hollow portions 160 can be larger than or equal to 0.1 mm, so as to make sure that the circuit is well covered.

Figure 2C:
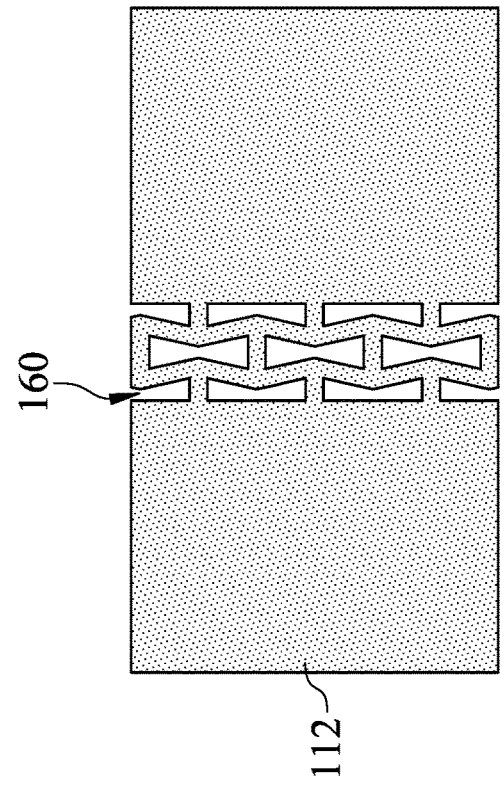
FIG. 2C is a partial top schematic view of the first cover film of the circuit board as being compressed in FIG. 2A.
Figure 2B:
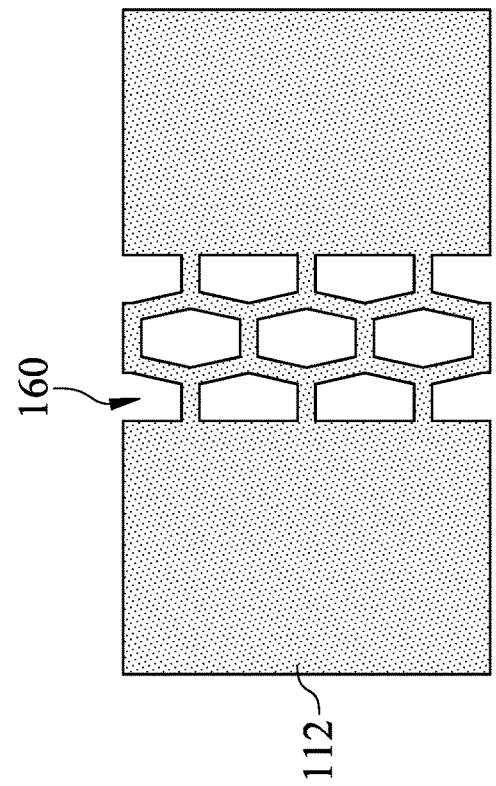
FIG. 2B is a partial top schematic view of a first cover film of the circuit board as being stretched in FIG. 2A.

Please also refer to FIG. 2B and FIG. 2C. FIG. 2B is a partial top schematic view of the first cover film 112 of the circuit board 100 as being stretched in FIG. 2A. FIG. 2C is a partial top schematic view of the first cover film 112 of the circuit board 100 as being compressed in FIG. 2A. When the at least one bending area 100a is bent, a force is applied on the plurality of hollow portions 160 to make the plurality of hollow portions 160 deform and change a cross-sectional area of each of the plurality of hollow portions 160. In FIG. 2B, when the circuit board 100 is stretched, the cross-sectional area of each of the plurality of hollow portions 160 expands to increase the length of the circuit board 100. In FIG. 2C, when the circuit board 100 is compressed, the cross-sectional area of each of the plurality of hollow portions 160 reduces to decrease the length of the circuit board 100. It should be mentioned that, when bending or twisting the circuit board 100, a part of the plurality of hollow portions 160 can expand while another part of the plurality of hollow portions 160 can shrink to make the circuit board 100 deform successfully. The plurality of hollow portions 160 which are hollowed can provide a space for movement when the circuit board 100 is deformed, and other structures of the circuit board 100 have a certain degree of elasticity to release the force by extension or compression.

Figure 4:
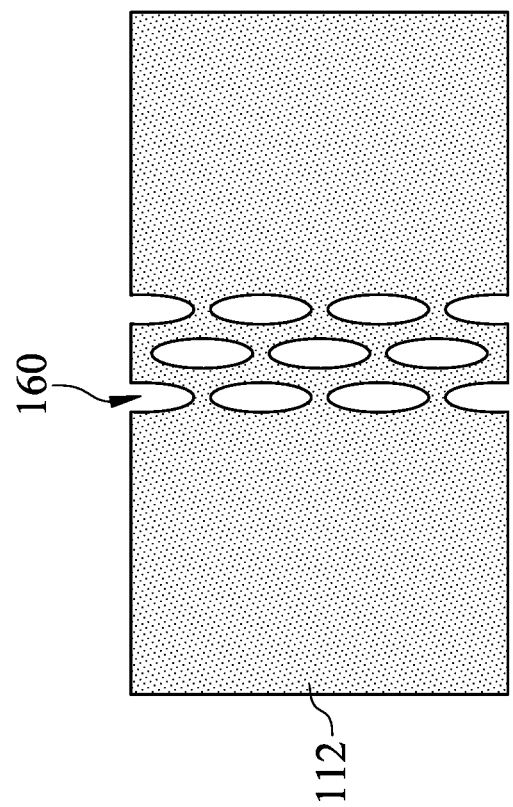
FIG. 4 is a partial top schematic view of a circuit board according to one another embodiment of the present disclosure.
Figure 3:
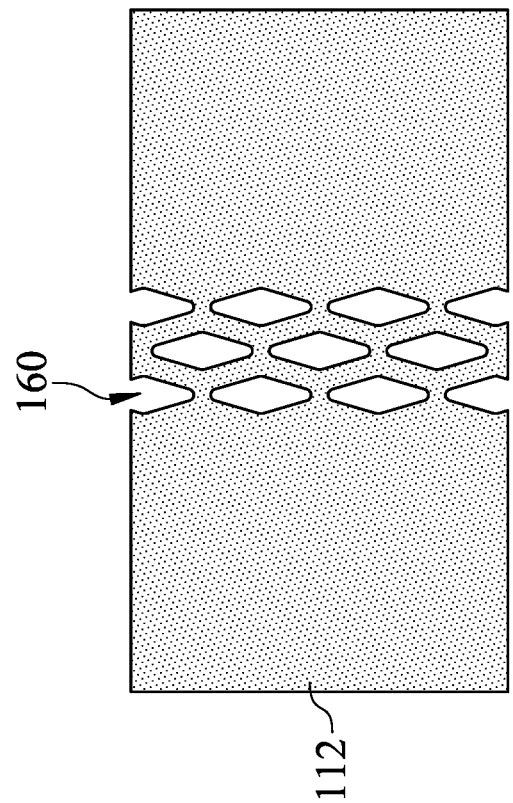
FIG. 3 is a partial top schematic view of a circuit board according to another embodiment of the present disclosure.

Please refer to FIG. 3 and FIG. 4. FIG. 3 is a partial top schematic view of the circuit board 100 according to another embodiment of the present disclosure. FIG. 4 is a partial top schematic view of the circuit board 100 according to one another embodiment of the present disclosure. When the at least one bending area 100a is flat, the surface shape of each of the plurality of hollow portions 160 can be oval as FIG. 3, or can be parallelogram as FIG. 4. No matter which shapes the plurality of hollow portions 160 are, the arrangement, length, width or distance between adjacent two of the plurality of hollow portions 160 can satisfy the aforementioned ranges, so the details will not be given again herein.

Figure 5:
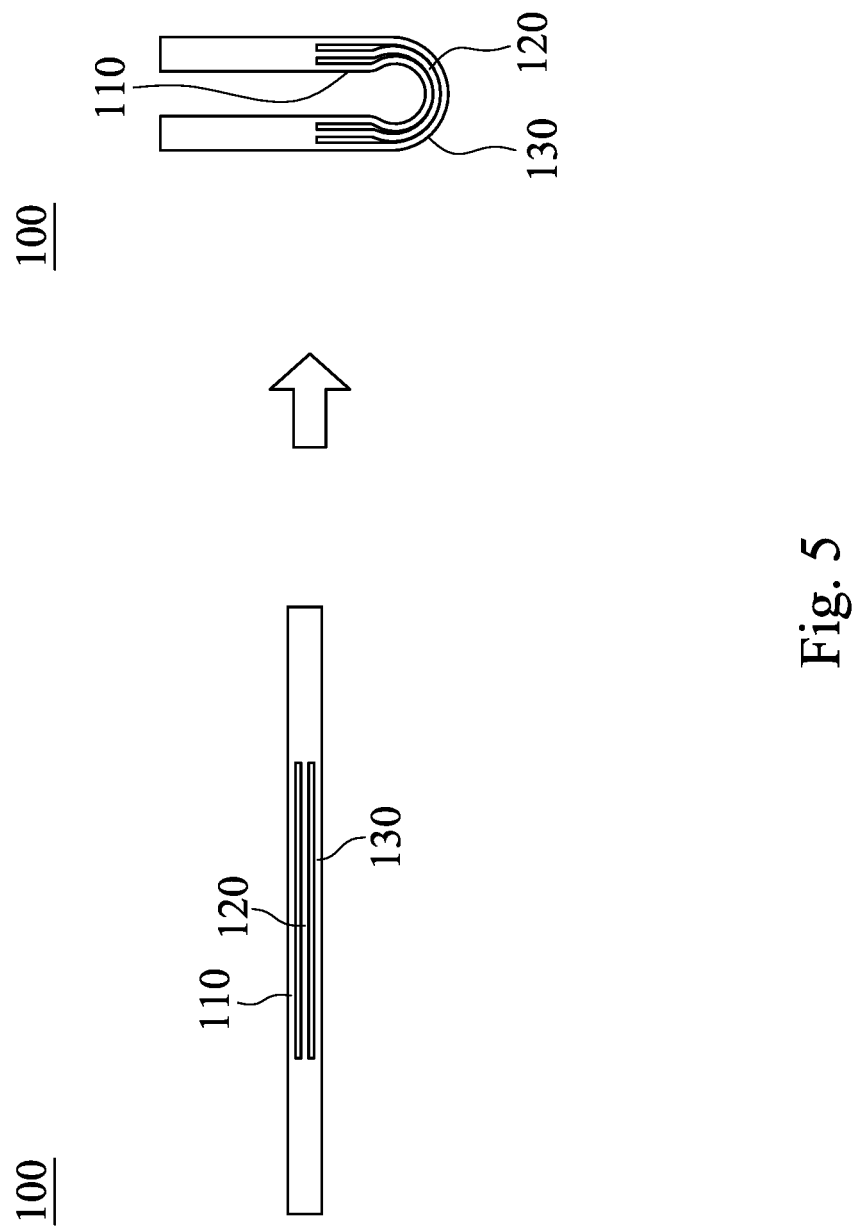
FIG. 5 is a bending schematic view of the circuit board according to one embodiment of the present disclosure.

Please refer to FIG. 5. FIG. 5 is a bending schematic view of the circuit board 100 according to one embodiment of the present disclosure. When bending the circuit board 100, one side of the circuit board 100a (the first multilayered structure 110 is taken for example herein) is compressed, and another side of the circuit board 100a (the third multilayered structure 130 is taken for example herein) is stretched. The cross-sectional area of each of the plurality of hollow portions 160 on the first multilayered structure 110 is decreased, and the cross-sectional area of each of the plurality of hollow portions 160 on the third multilayered structure 130 is increased. Therefore, the bending radius of the first multilayered structure 110 is reduced and the bending radius of the third multilayered structure 130 is enlarged, so as to make the bending sizes of the first multilayered structure 110, the second multilayered structure 120 and the third multilayered structure 130 match to each other to prevent buckling deformation. Therefore, the problem of structural damage due to the deformation of the circuit board 100 can be reduced, which is favorable for extending the service life of the circuit board 100.

Figure 6B:
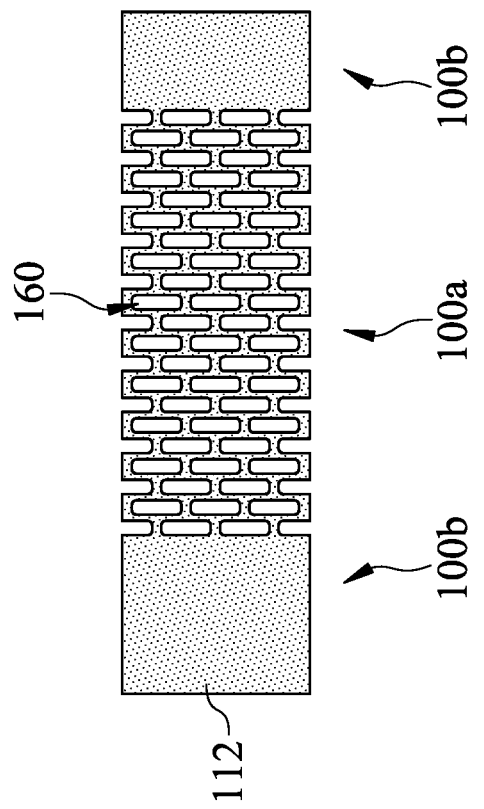
FIG. 6B is a partial top schematic view of a circuit board according to yet another embodiment of the present disclosure.
Figure 6A:
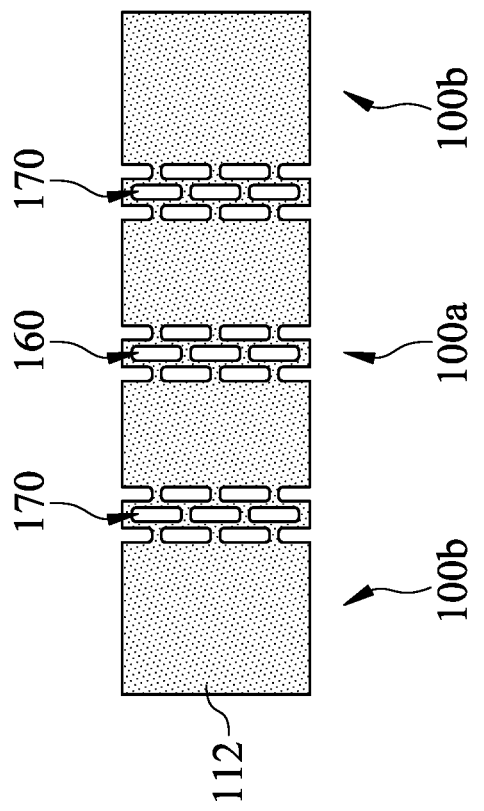
FIG. 6A is a partial top schematic view of a circuit board according to still another embodiment of the present disclosure.

Please refer to FIG. 6A. FIG. 6A is a partial top schematic view of the circuit board 100 according to still another embodiment of the present disclosure. The circuit board 100 can further include a plurality of additional hollow portions 170, which are formed on at least one of the first multilayered structure 110, the second multilayered structure 120 and the third multilayered structure 130. The plurality of additional hollow portions 170 can be communicated with at least one of the first compartment S1 and the second compartment S2. The position, structure and size features of the plurality of additional hollow portions 170 can be the same as or similar to the aforementioned plurality of hollow portions 160, and the details will not be given again herein.

The plurality of additional hollow portions 170 can be arranged in two sides of the at least one bending area 100a which are adjacent to the at least one non-bending area 100b, and the plurality of additional hollow portions 170 and the plurality of hollow portions 160 can be separated from each other. Therefore, the plurality of additional hollow portions 170 can also help releasing the force to further improve the deformation and restoring ability of the circuit board 100.

Please refer to FIG. 6B. FIG. 6B is a partial top schematic view of the circuit board 100 according to yet another embodiment of the present disclosure. The plurality of hollow portions 160 can be evenly distributed in the at least one bending area 100a to make the plurality of hollow portions 160 be arranged all around in the at least one bending area 100a, so as to improve the bending ability of the circuit board 100. According to the aforementioned embodiments, the plurality of hollow portions 160 and the plurality of additional hollow portions 170 can be formed on a single multilayered structure or on multiple multilayered structures, and can be arranged in one part, multiple parts or everywhere of the at least one bending area 100a. Also, the positions of the plurality of hollow portions 160 and the plurality of additional hollow portions 170 on different multilayered structures can be corresponding to or be staggered from each other for different purposes of use. Therefore, the present disclosure is not limited to the actual positions of the plurality of hollow portions 160 and the plurality of additional hollow portions 170.

Figure 7A:
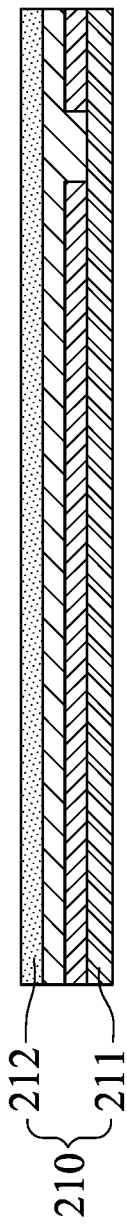
FIG. 7A to FIG. 7F are cross-sectional schematic views of each step in a manufacturing method of a circuit board according to yet another embodiment of the present disclosure.
Figure 7B:
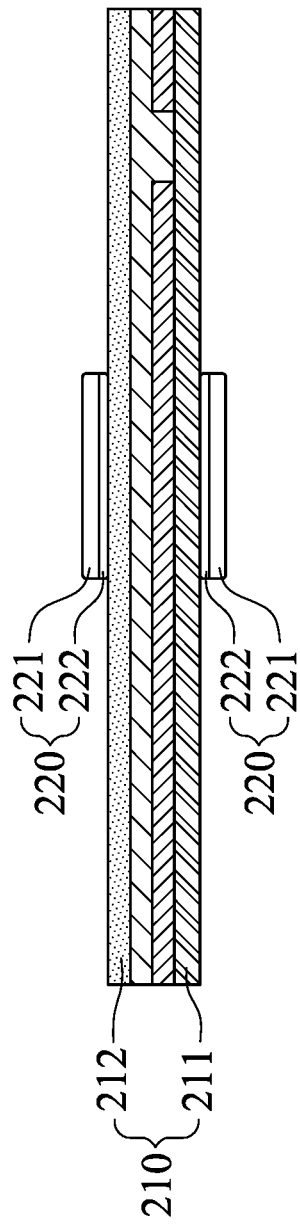
Figure 7C:
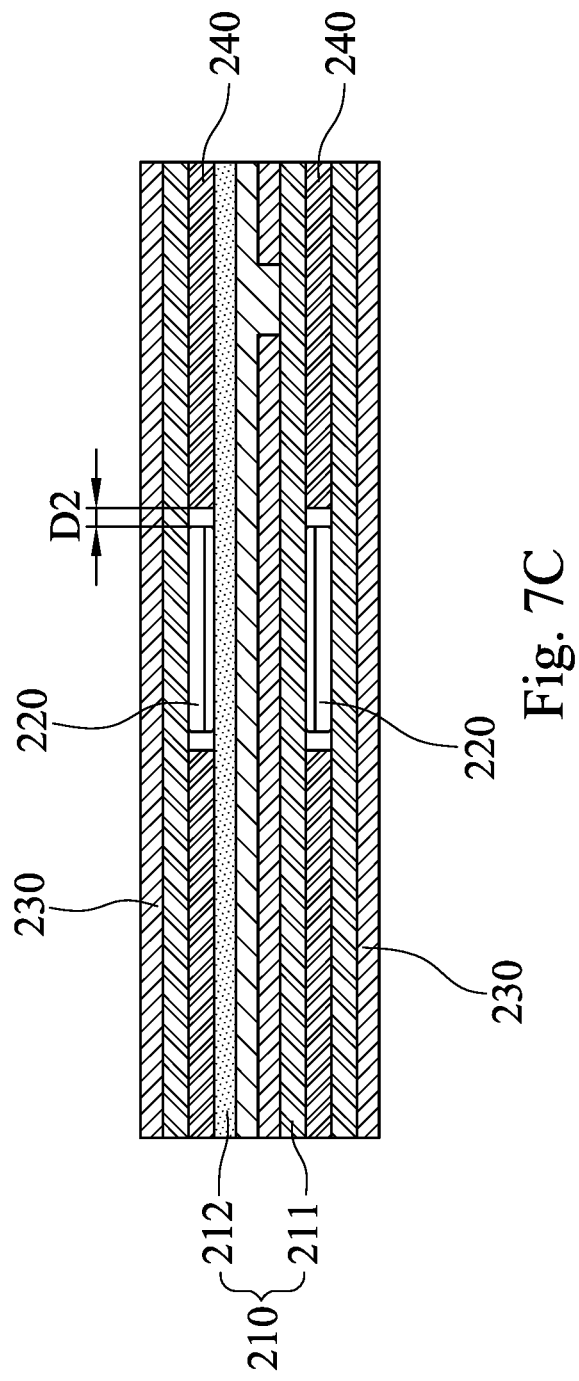
Figure 7D:
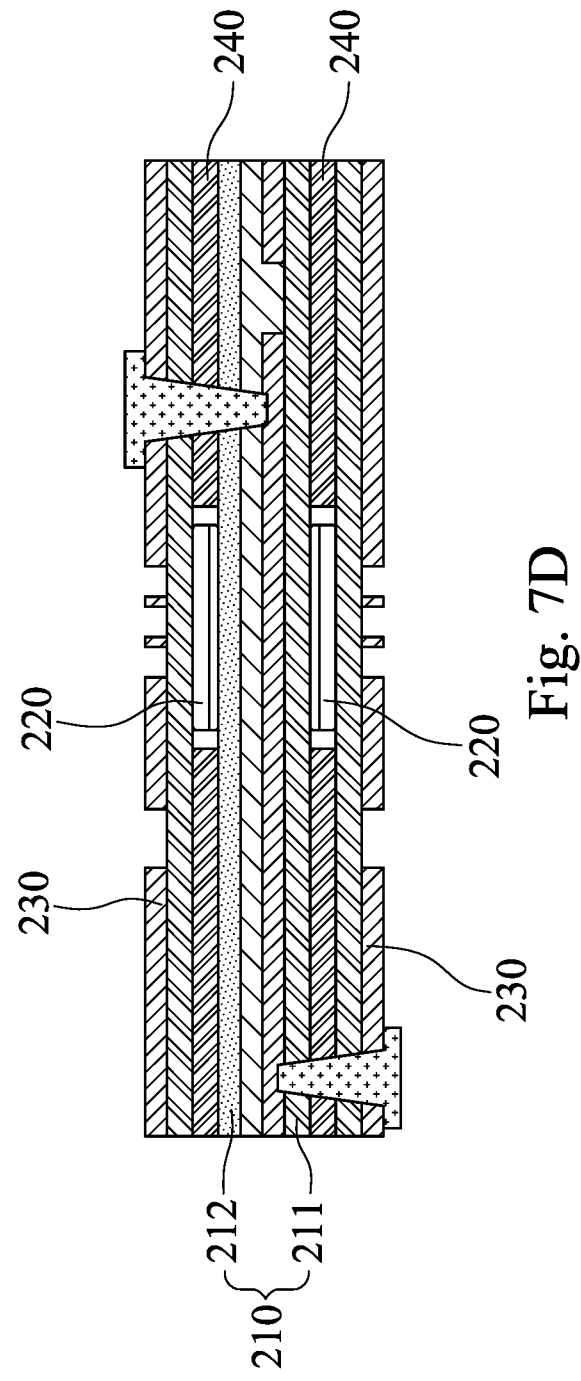
Figure 7E:
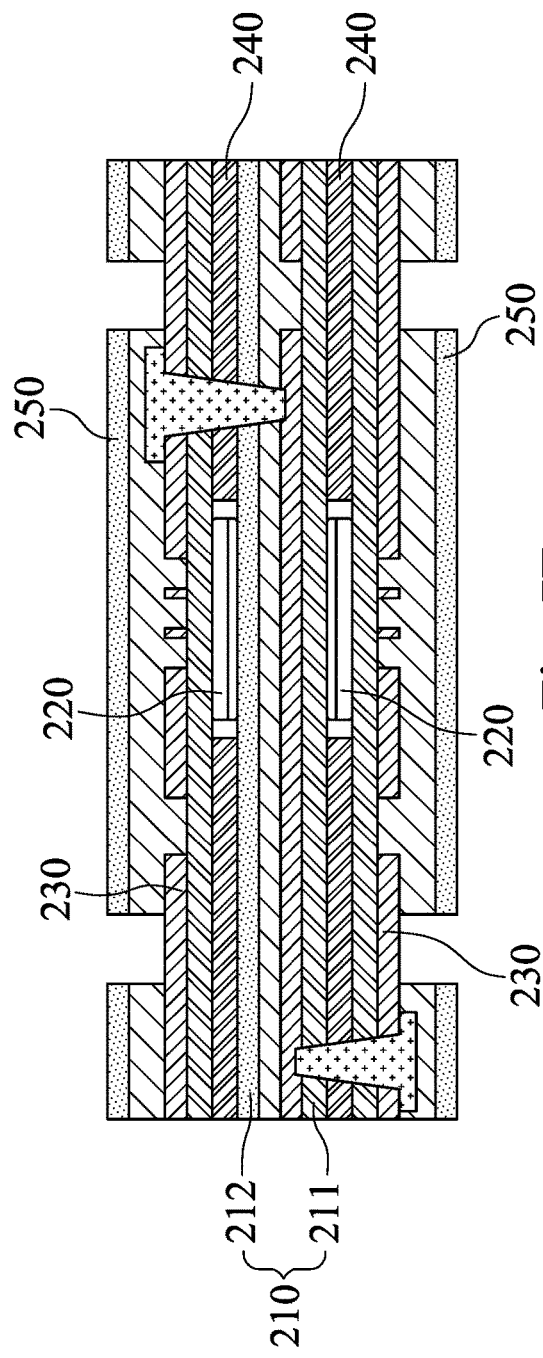
Figure 7F:
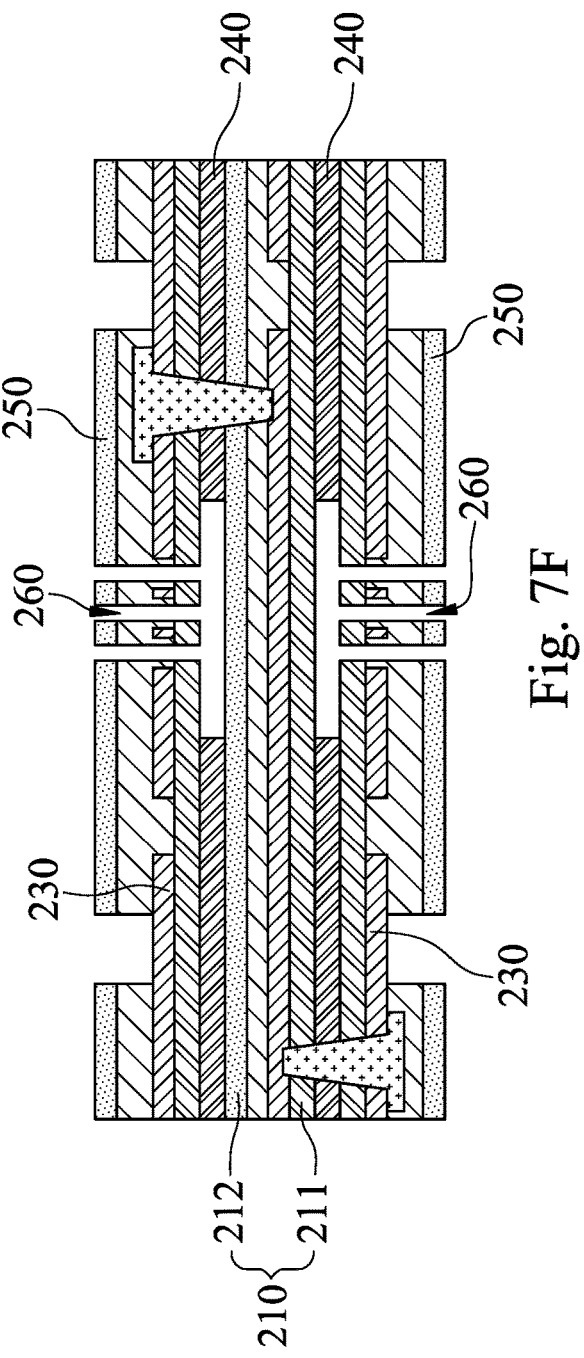
Figure 8:
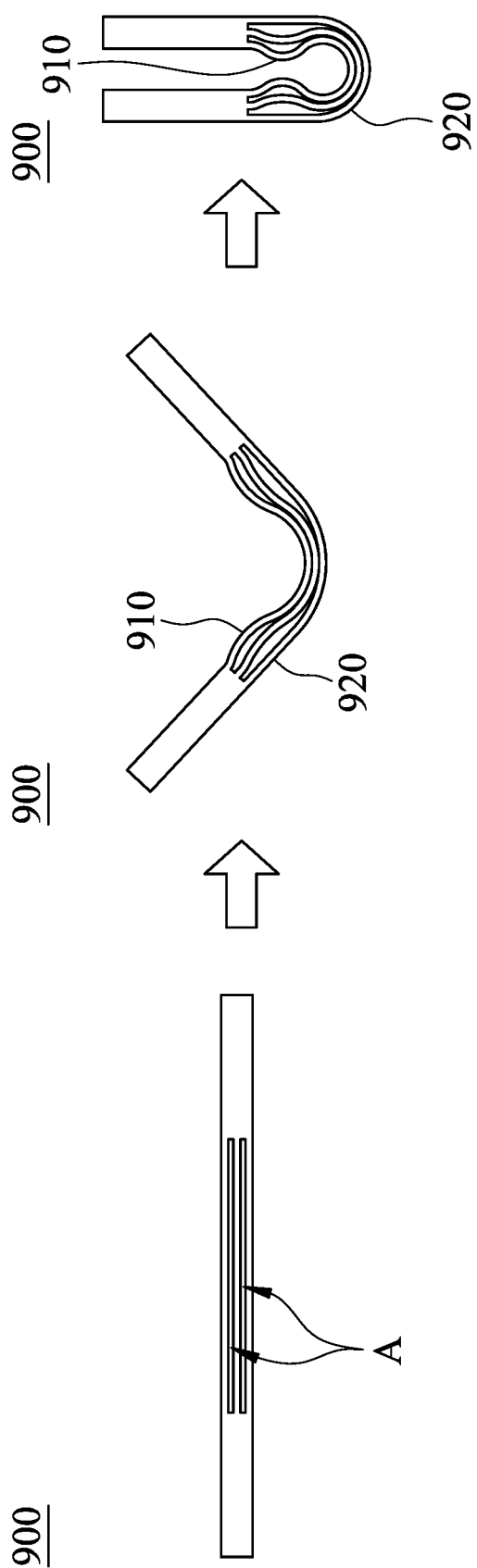
FIG. 8 is a bending schematic view of a conventional flexible circuit board.

Please refer to FIG. 7A and FIG. 7F. FIG. 7A to FIG. 7F are cross-sectional schematic views of each step in a manufacturing method of the circuit board according to yet another embodiment of the present disclosure. First, in FIG. 7A, a multilayered structure 210 is provided. The multilayered structure 210 includes a flexible material layer 211 and a cover layer 212, and the cover layer 212 is disposed on the flexible material layer 211. Inner circuit can be arranged in the multilayered structure 210 in advance.

Next, in FIG. 7B, two spacers 220 are stuck to two sides of the multilayered structure 210 respectively, so as to make the two spacers 220 respectively be connected to the flexible material layer 211 and the cover layer 212. The two spacers 220 can respectively include a spacer material layer 221 and a spacer adhesive layer 222. When sticking the two spacers 220, the spacer adhesive layers 222 can be faced to the multilayered structure 210, and a pressure is applied to make the two spacers 220 be stuck to the multilayered structure 210. The material of the spacer material layers 221 can be polyester or polyimide, and the thickness thereof can be 5 μm to 25 μm. The material of the spacer adhesive layers 222 can be thermoplastic polymer, such as thermoplastic acrylic polymer, and the thickness thereof can be 5 μm to 15 μm. The adhesive force between the spacer adhesive layers 222 and the multilayered structure 210 can be less than or equal to 200 mN/25 mm, so as to make sure that the two spacers 220 can be successfully peeled off without residual adhesive.

Next, in FIG. 7C, two flexible material films 230 are stuck to the two sides of the multilayered structure 210 respectively, so as to make the two flexible material films 230 respectively be connected to the flexible material layer 211 and the cover layer 212, and the two spacers 220 are respectively arranged between the two flexible material films 230 and the multilayered structure 210. The two flexible material films 230 can be respectively adhered to the multilayered structure 210 through an adhesive layer 240, and a distance D2 between the two adhesive layers 240 and the two spacers 220 can be larger than or equal to 0.5 mm, so as to prevent the two adhesive layers 240 and the two spacers 220 sticking to each other.

Next, in FIG. 7D, before performing the following steps, the two flexible material films 230 can be electrically connected to the flexible material layer 211 respectively. In this step, the two flexible material films 230 can be etched and selectively plated with copper, so as to build a proper circuit between the two flexible material films 230 and the multilayered structure 210.

Next, in FIG. 7E, two cover films 250 are stuck to the two flexible material films 230 respectively, so as to make the two flexible material films 230 be respectively arranged between the two cover films 250 and the multilayered structure 210. The two cover films 250 and the aforementioned cover layer 212 can be pressed to be combined with the two flexible material films 230 or the flexible material layer 211, so as to protect the circuit on the two flexible material films 230 and the flexible material layer 211.

Next, in FIG. 7F, a plurality of hollow portions 260 are arranged. The plurality of hollow portions 260 are formed on at least two of the flexible material layer 211, the cover layer 212, the two flexible material films 230 and the two cover films 250, and the plurality of hollow portions 260 extend to at least one of the two spacers 220. When the plurality of hollow portions 260 are arranged, the two spacers 220 can be peeled off from the two sides to remove the two spacers 220.

The plurality of hollow portions 260 can be cut by a UV laser fixed-depth cutting method. A distance between the outer edge of the plurality of hollow portions 260 and the circuit can be larger than or equal to 0.1 mm. The flexible material film 230 and the cover film 250 of the same side can be cut through, but the spacer 220 thereof is not cut through, to form the plurality of hollow portions 260 on a single side as cutting. Furthermore, the plurality of hollow portions 260 can be cut on the multilayered structure 210 in advance. By selectively arranging the plurality of hollow portions 260 on the multilayered structure 210, the two flexible material films 230 and the two cover films 250, the varieties of arranging the plurality of hollow portions 260 can be increased.

In this regard, the circuit board of the present disclosure can help releasing the compressive stress and tensile stress when the circuit board is bent by disposing the plurality of hollow portions into a honeycomb arrangement. Therefore, the bending sizes of different multilayered structures can match to each other to prevent buckling deformation. The problem of structural damage due to the deformation of bending the circuit board can be reduced, which is favorable for extending the service life of the circuit board.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A circuit board, comprising at least one bending area and at least one non-bending area, wherein the at least one bending area abuts the at least one non-bending area, and the circuit board comprising:
    a first multilayered structure, comprising:
        a first flexible material layer; and
        a first cover film disposed on the first flexible material layer;
    a second multilayered structure, comprising:
        a second flexible material layer; and
        a second cover film disposed on the second flexible material layer;
    a third multilayered structure, comprising:
        a third flexible material layer; and
        a third cover film disposed on the third flexible material layer;
    a first adhesive layer disposed between the first multilayered structure and the second multilayered structure, and adhered to the first flexible material layer and the second cover film, wherein the first flexible material layer, the first adhesive layer and the second cover film are arranged between the first cover film and the second flexible material layer;
    a second adhesive layer disposed between the second multilayered structure and the third multilayered structure, and adhered to the second flexible material layer and the third flexible material layer, wherein the second multilayered structure is arranged between the first adhesive layer and the second adhesive layer, and the second flexible material layer, the second adhesive layer and the third flexible material layer are arranged between the second cover film and the third cover film;
    wherein a first compartment is formed between the first multilayered structure and the second multilayered structure, and a second compartment is formed between the second multilayered structure and the third multilayered structure; and
    a plurality of hollow portions formed on at least one of the first multilayered structure, the second multilayered structure and the third multilayered structure, wherein the plurality of hollow portions, the first compartment and the second compartment are arranged in the at least one bending area, and the plurality of hollow portions are communicated with at least one of the first compartment and the second compartment;
    wherein the first flexible material layer is electrically connected to the second flexible material layer in the at least one non-bending area, and the second flexible material layer is electrically connected to the third flexible material layer in the at least one non-bending area.

2. The circuit board of claim 1, wherein the plurality of hollow portions are arranged in a staggered way.

3. The circuit board of claim 1, wherein each of the plurality of hollow portions has a length and a width, and a ratio of the length to the width is larger than or equals to 1.

4. The circuit board of claim 3, wherein the width is larger than or equals to 0.3 mm.

5. The circuit board of claim 1, wherein a shortest distance between adjacent two of the plurality of hollow portions is larger than or equals to 0.3 mm.

6. The circuit board of claim 1, further comprising:
    a plurality of additional hollow portions formed on at least one of the first multilayered structure, the second multilayered structure and the third multilayered structure, wherein the plurality of additional hollow portions are communicated with at least one of the first compartment and the second compartment;
    wherein the plurality of additional hollow portions are arranged in two sides of the at least one bending area which are adjacent to the at least one non-bending area, and the plurality of additional hollow portions and the plurality of hollow portions are separated from each other.

7. The circuit board of claim 1, wherein when the at least one bending area is flat, a surface shape of each of the plurality of hollow portions is oval, rectangular or parallelogram.

* * * * *